(12) United States Patent
Lin et al.

(10) Patent No.: US 10,608,408 B1
(45) Date of Patent: Mar. 31, 2020

(54) LASER SUBASSEMBLY HAVING IMPEDANCE-MATCHING NETWORK INTEGRATED ON LASER SUBMOUNT AND A TRANSMITTER OPTICAL SUBASSEMBLY (TOSA) IMPLEMENTING SAME

(71) Applicant: Applied Optoelectronics, Inc., Sugar Land, TX (US)

(72) Inventors: Kai-Sheng Lin, Sugar Land, TX (US); Ziliang Cai, Richmond, TX (US); Chong Wang, Stafford, TX (US)

(73) Assignee: Applied Optoelectronics, Inc, Sugar Land, TX (US)

(*) Notice: Subject to any disclaimer, the term of this patent is extended or adjusted under 35 U.S.C. 154(b) by 0 days.

(21) Appl. No.: 16/202,854

(22) Filed: Nov. 28, 2018

(51) Int. Cl.
*H01S 5/042* (2006.01)
*G02B 6/42* (2006.01)
*H01S 5/40* (2006.01)
*H01S 5/022* (2006.01)

(52) U.S. Cl.
CPC .......... *H01S 5/0427* (2013.01); *G02B 6/4246* (2013.01); *H01S 5/02284* (2013.01); *H01S 5/4012* (2013.01); *H01S 5/4025* (2013.01)

(58) Field of Classification Search
CPC .. H01S 5/02284; H01S 5/0261; H01S 5/0427; H01S 5/4012; H01S 5/4025
See application file for complete search history.

(56) References Cited

U.S. PATENT DOCUMENTS

2004/0114650 A1* 6/2004 Tanaka ................... H01S 5/042
372/38.02

* cited by examiner

*Primary Examiner* — Michael Carter
(74) *Attorney, Agent, or Firm* — Grossman Tucker Perreault & Pfleger, PLLC; Norman S. Kinsella

(57) ABSTRACT

The present disclosure is generally directed to a laser subassembly for use in a TOSA module that includes an integrated impedance matching network to enable a plurality of selectable resistance configurations to ensure the driving circuit and laser emitter of the TOSA module have matching, or substantially matching, impedances. The laser subassembly includes a substrate with a driving circuit disposed thereon. The driving circuit includes signal conductors for electrically coupling to an external transmit connecting circuit, a conductive laser mounting section, and an impedance matching network. The impedance matching network includes a plurality of resistors, with one or more of the resistors being selectively electrically coupled to the conductive laser mounting section to introduce a selected amount of impedance to minimize or otherwise reduce reflection.

20 Claims, 12 Drawing Sheets

US 10,608,408 B1

LASER SUBASSEMBLY HAVING IMPEDANCE-MATCHING NETWORK INTEGRATED ON LASER SUBMOUNT AND A TRANSMITTER OPTICAL SUBASSEMBLY (TOSA) IMPLEMENTING SAME

TECHNICAL FIELD

The present disclosure relates to optical communications and more particularly, to a laser submount with an integrated impedance matching network having a plurality of selectable resistances to match, or at least substantially match a load impedance of an associated laser emitter.

BACKGROUND INFORMATION

Optical transceivers are used to transmit and receive optical signals for various applications including, without limitation, internet data center, cable TV broadband, and fiber to the home (FTTH) applications. Optical transceivers provide higher speeds and bandwidth over longer distances, for example, as compared to transmission over copper cables. The desire to provide higher speeds in smaller optical transceiver modules for a lower cost has presented challenges, for example, with respect to thermal management, insertion loss, and manufacturing yield.

Optical transceiver modules generally include one or more transmitter optical subassemblies (TOSAs) for transmitting optical signals and one or more receiver optical subassemblies (ROSAs) for receiving optical signals. In general, TOSAs include one or more lasers to emit one or more channel wavelengths and associated circuitry for driving the lasers. In general, ROSAs include a demultiplexer and one or more lenses to receive and de-multiplex channel wavelengths for output as a proportional electrical signal.

The demand for high speed data communication continues to increase due to the prevalence of FTTH and other data services. The standardization for 100G Ethernet was completed in 2010, and since then the adoption of 100G Ethernet transceivers continues to grow. Manufacturers of optical transceiver modules face non-trivial challenges related to reducing costs without sacrificing performance. For example, at data rates of 25 Gb/s and greater, transmitter optical subassemblies (TOSAs) become a major portion of the overall costs to manufacture optical transceiver devices.

BRIEF DESCRIPTION OF THE DRAWINGS

These and other features and advantages will be better understood by reading the following detailed description, taken together with the drawings wherein.

DETAILED DESCRIPTION

Figure 1A:
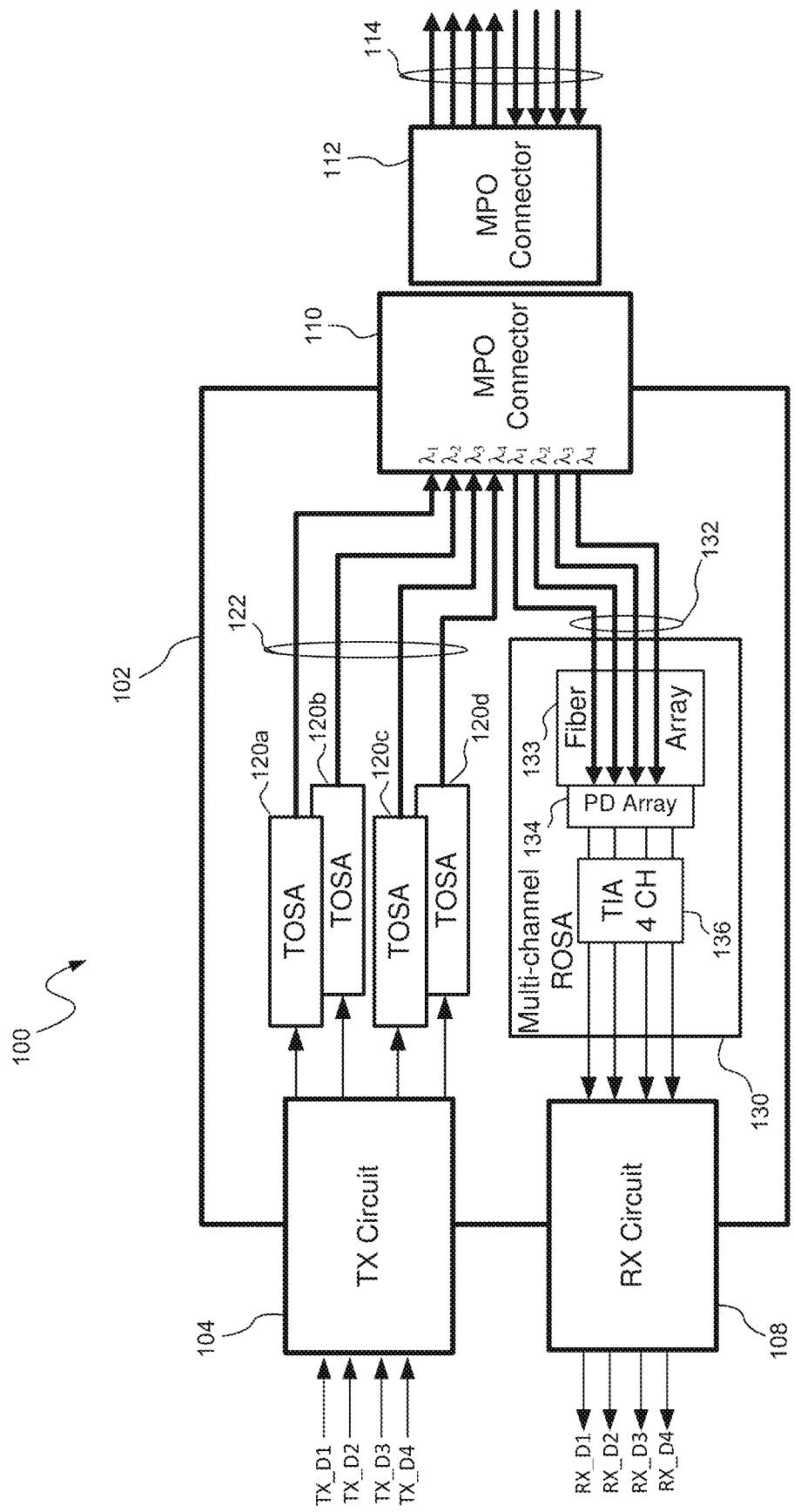
FIGS. 1A and 1B are block diagrams of multi-channel optical transceivers, consistent with embodiments of the present disclosure.

As discussed above, TOSAs represent a significant portion of the cost in producing optical transceiver systems. Laser devices, also known as laser emitters, that can produce data rates up to and beyond 25 Gbps, for example, require not only high-quality laser diodes but further require consideration of heat dissipation, signal path distances, and printed circuit board (PCB) layout. Such high-speed modulation by a laser device also generally requires relatively precise impedance matching, e.g., ±10%, to ensure nominal performance. Some TOSA approaches utilize a so-called "unmatched" configuration, without concern for impedance mismatches. However, reflection remains an unavoidable problem and such unmatched configurations rely on impedance transfer circuits or drivers capable of compensating, for instance. Therefore, the increased cost, complexity and footprint to use unmatched configurations makes this option often undesirable, particularly as optical subassembly modules continue to scale.

Impedance matching can be modeled by software simulation, or manually through computation. However, optical modules have several constraining factors such as frequency over Gbps, variations in the laser driver model, the signal transmission line and the laser device itself. Laser device characteristics can change between both laser types and laser manufacturer. These factors often make impedance matching complex, and any change in one or more of the TOSA-related components can require additional computations and redesigns to ensure impedance is sufficiently matched.

Impedance mismatches between, for instance, laser driver terminals and PCB traces, different PCB traces on the same board, interconnection devices such a flexible PCBs and other elements can result in reflection. Reflections manifest as a portion of a driving signal reflected back towards the driving signal source, which can bounce back and forth until the reflection is attenuated. These signal reflections can significantly impact the driving signal quality which can lower the overall signal to noise (SNR) ratio.

The amount of reflected driving signal from the load, e.g., the laser device, depends on the delta between the driving signal source and the load impedance. The reflection coefficient expression may be calculated based on Equation 1:

$$\Gamma_L = \frac{V_{RELF}}{V_{IN}} = \frac{Z_L - Z_0}{Z_L + Z_0} \qquad \text{Equation (1)}$$

where ($Z_0$) is the transmission line impedance and ($Z_L$) is the load impedance, generally between 10 ohms and 250 ohms. A matched system therefore has an equal, or substantially equal, load impedance ($Z_L$) and transmission line impedance ($\Gamma_L$) (($Z_L$)−($\Gamma_L$)=0), and in such cases reflection is theoretically zero. This is a significant goal of the TOSA module design.

Laser devices such as distributed feedback (DFB) and Fabry-Perot (FP) can have low resistance values, e.g., 7 to 10 ohms. Interconnect devices such as FPCBs can have relatively higher resistances in the range of about 25 ohms. Such a mismatch can cause significant reflection. Some designs include resistors integrated in the TOSA, and in particular, one or more resistors disposed electrically in parallel with the laser device that generates the load in order to reduce or eliminate that reflection.

The resistance value for each of the one or more integrated resistors may be predetermined by calculating impedance based on nominal or measured characteristics of the supporting circuitry and the laser device itself and Equation (1). However, as discussed above, resistance values can vary significantly between laser emitter types and also between manufacturers. Thus, manufacturers may invest significant resources into manufacturing TOSA modules with a particular laser emitter and be largely unable to switch over to other laser devices without incurring significant costs and dedication of resources. Such a change to the laser device may necessitate a complete re-calculation for impedance matching as well as re-design of the resistor circuitry, PCB layout, and so on. This can result in a manufacturer being unable to take advantage of laser devices that may be more efficient, less-expensive, and/or more widely available. Such inflexibility remains a significant barrier to the development and continued evolution of TOSA modules, and can ultimately impact yield.

Thus, in accordance with an embodiment of the present disclosure, a laser subassembly for use in a TOSA module is disclosed that includes an integrated impedance matching network to enable a plurality of selectable resistance configurations to ensure that the driving circuit and laser emitter of the TOSA module have matching, or substantially matching impedances. The laser subassembly includes a substrate with a driving circuit disposed thereon. The driving circuit includes signal conductors for electrically coupling to an external transmit connecting circuit, a conductive laser mounting section, and an impedance matching network. The impedance matching network includes a plurality of resistors, with one or more of the resistors being selectively electrically coupled to the conductive laser mounting section to introduce a selectable amount of impedance. Therefore, the impedance matching network accommodates a plurality of different laser emitters having different load impedances by allowing technicians during manufacturing to couple a resistor, or resistor combination, provided by the impedance matching network to ensure that the driving circuit and laser device have substantially matched impedances, e.g., within 10%.

The laser subassembly with an integrated impedance matching network disclosed herein provides numerous advantages over other approaches that match impedance based on a static configuration of resistor(s). For example, a TOSA module consistent with the present disclosure can match impedances of multiple different laser devices, even when those laser devices have largely varying impedances, e.g., 10, 50 and 250 ohms, using a relatively small number of resistors and interconnections between those resistors.

Furthermore, a TOSA module consistent with the present disclosure offers both course-grain and fine-grain impedance selection. For instance, one embodiment of the present disclosure includes utilizing a three-resistor network that includes a 250, 50 and 10 ohm resistor in series to allow for matching of 250, 50 and 10 ohm impedance loads. However, some laser emitters may have an actual impedance load that varies from 2-10% of their nominal values. Therefore, the three-resistor network disclosed herein may be utilized to achieve intermediate resistances by coupling resistors in series and/or parallel with each other. For instance, in the context of laser emitters with about a 10-ohm load impedance, the three-resistor network can achieve 8.06, 9.62, 9.62, or 10 ohms depending on a desired configuration. By simply selecting a different combination of resistors within the impedance matching network to achieve a matching, or substantially matching, impedance, laser devices may be easily changed out on the subassembly for other laser emitter types with potentially different associated load impedances. Thus, a TOSA module consistent with the present disclosure can accommodate a wide-range of load impedances utilizing a relatively small number of resistors, and in a relatively compact footprint that can be integrated in close proximity on the same substrate with an associated laser emitter.

As used herein, "channel wavelengths" refer to the wavelengths associated with optical channels and may include a specified wavelength band around a center wavelength. In one example, the channel wavelengths may be defined by an International Telecommunication (ITU) standard such as the ITU-T dense wavelength division multiplexing (DWDM) grid. This disclosure is equally applicable to coarse wavelength division multiplexing (CWDM). In one specific example embodiment, the channel wavelengths are implemented in accordance with local area network (LAN) wavelength division multiplexing (WDM), which may also be referred to as LWDM. The term "coupled" as used herein refers to any connection, coupling, link or the like and "optically coupled" refers to coupling such that light from one element is imparted to another element. Such "coupled" devices are not necessarily directly connected to one another and may be separated by intermediate components or devices that may manipulate or modify such signals.

The term substantially, as generally referred to herein, refers to a degree of precision within acceptable tolerance that accounts for and reflects minor real-world variation due to material composition, material defects, and/or limitations/peculiarities in manufacturing processes. Such variation may therefore be said to achieve largely, but not necessarily wholly, the stated characteristic. To provide one non-limiting numerical example to quantify "substantially," minor variation may cause a deviation of up to and including ±5% from a particular stated quality/characteristic unless otherwise provided by the present disclosure.

Referring to the Figures, FIG. 1A, an optical transceiver 100, consistent with embodiments of the present disclosure, is shown and described. In this embodiment, the optical transceiver 100 transmits and receives four (4) channels using four different channel wavelengths ($\lambda 1, \lambda 2, \lambda 3, \lambda 4$) and may be capable of transmission rates of at least about 25 Gbps per channel. In one example, the channel wavelengths $\lambda 1, \lambda 2, \lambda 3, \lambda 4$ may be 1270 nm, 1290 nm, 1310 nm, and 1330 nm, respectively. Other channel wavelengths are within the scope of this disclosure including those associated with local area network (LAN) wavelength division multiplexing (WDM). The optical transceiver 100 may also be capable of transmission distances of 2 km to at least about 10 km. The optical transceiver 100 may be used, for example, in internet data center applications or fiber to the home (FTTH) applications.

This embodiment of the optical transceiver 100 includes multiple transmitter optical subassemblies (TOSAs) 120a-d for transmitting optical signals on different channel wavelengths and a multi-channel receiver optical subassembly (ROSA) 130 for receiving optical signals on different channel wavelengths. The TOSAs 120a-d and the multi-channel ROSA 130 are located in a transceiver housing 102.

A transmit connecting circuit 104 and a receive connecting circuit 108 provide electrical connections to the TOSAs 120a-d and the multi-channel ROSA 130, respectively, within the housing 102. The transmit connecting circuit 104 is electrically connected to the electronic components (e.g., the laser, monitor photodiode, etc.) in each of the TOSAs 120*a-d* and the receive connecting circuit 108 is electrically connected to the electronic components (e.g., the photodiodes, the TIA, etc.) in the multi-channel ROSA 130. The transmit connecting circuit 104 and the receive connecting circuit 108 may be flexible printed circuits (FPCs) including at least conductive paths to provide electrical connections and may also include additional circuitry.

Each of the TOSAs 120*a-d* may be implemented with a laser subassembly 200 having an integrated impedance matching network as discussed in greater detail below. Each TOSA may be electrically coupled to conductive paths on the transmit connecting circuit 104 and be configured to receive driving signals (e.g., TX_D1 to TX_D4) and launch channel wavelengths on to fibers of the transmit optical fibers 122.

A multi-fiber push on (MPO) connector 110 provides optical connections to the TOSAs 120*a-d* and the multi-channel ROSA 130 within the housing 102. The MPO connector 110 is optically coupled to the TOSAs 120*a-d* and the multi-channel ROSA 130 via transmit optical fibers 122 and receive optical fibers 132, respectively. The MPO connector 110 is configured to be coupled to a mating MPO connector 112 such that the optical fibers 122, 132 in the optical transceiver 100 are optically coupled to external optical fibers 114.

Continuing on, this embodiment of the multi-channel ROSA 130 shown in FIG. 1A includes a photodetector array 134 including, for example, photodiodes optically coupled to a fiber array 133 formed by the ends of the receive optical fibers 132. The multi-channel ROSA 130 also includes a multi-channel transimpedance amplifier 136 electrically connected to the photodetector array 134. The photodetector array 134 and the transimpedance amplifier 136 detect and convert optical signals received from the fiber array 133 into electrical data signals (RX_D1 to RX_D4) that are output via the receive connecting circuit 108. Other embodiments of a ROSA may also be used in the transceiver 100 for receiving and detecting one or more optical signals.

This embodiment of the optical transceiver 100 does not include an optical multiplexer or demultiplexer. The optical signals may be multiplexed and demultiplexed external to the optical transceiver 100.

Figure 1B:
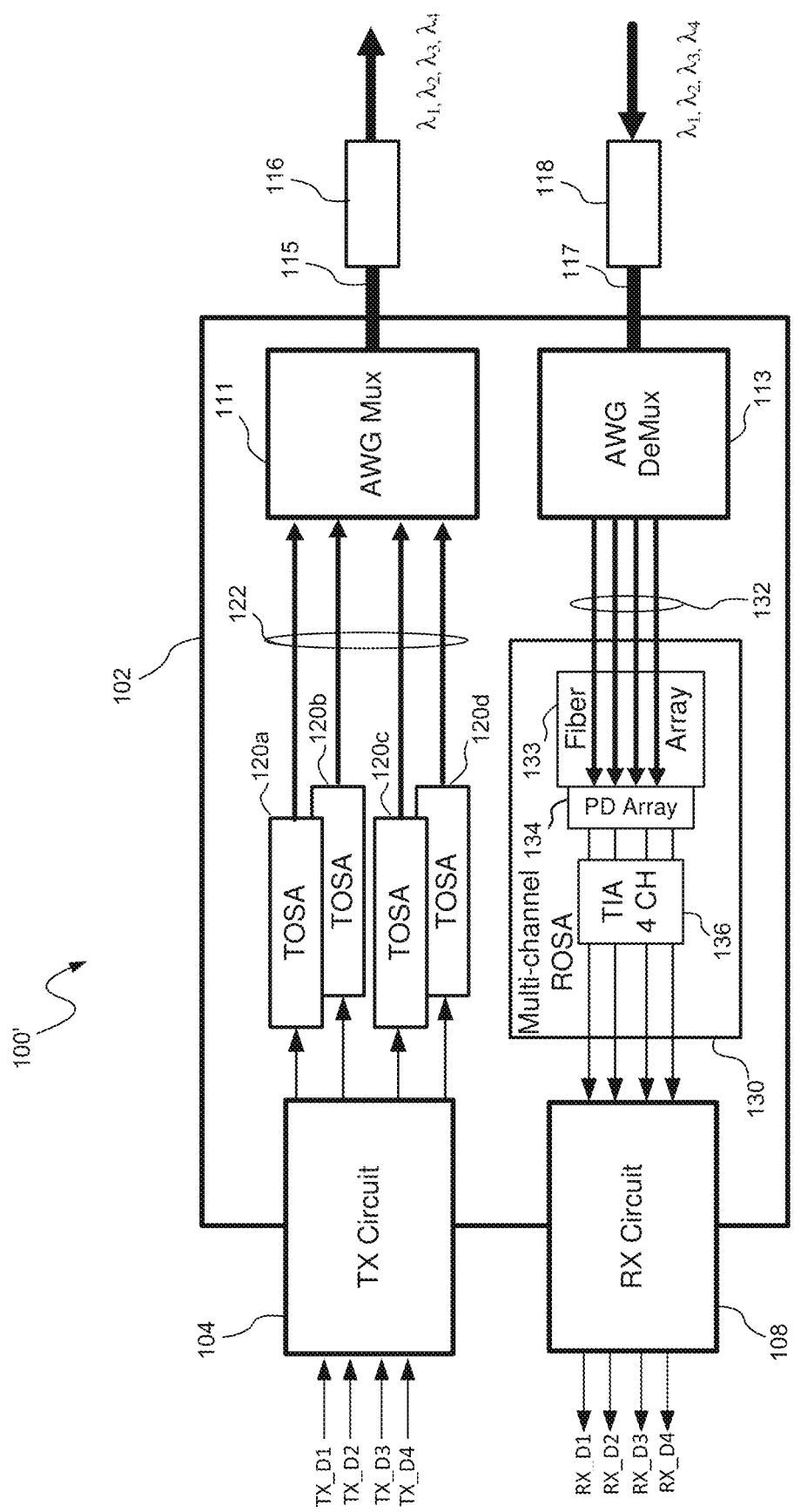
Figure 2:
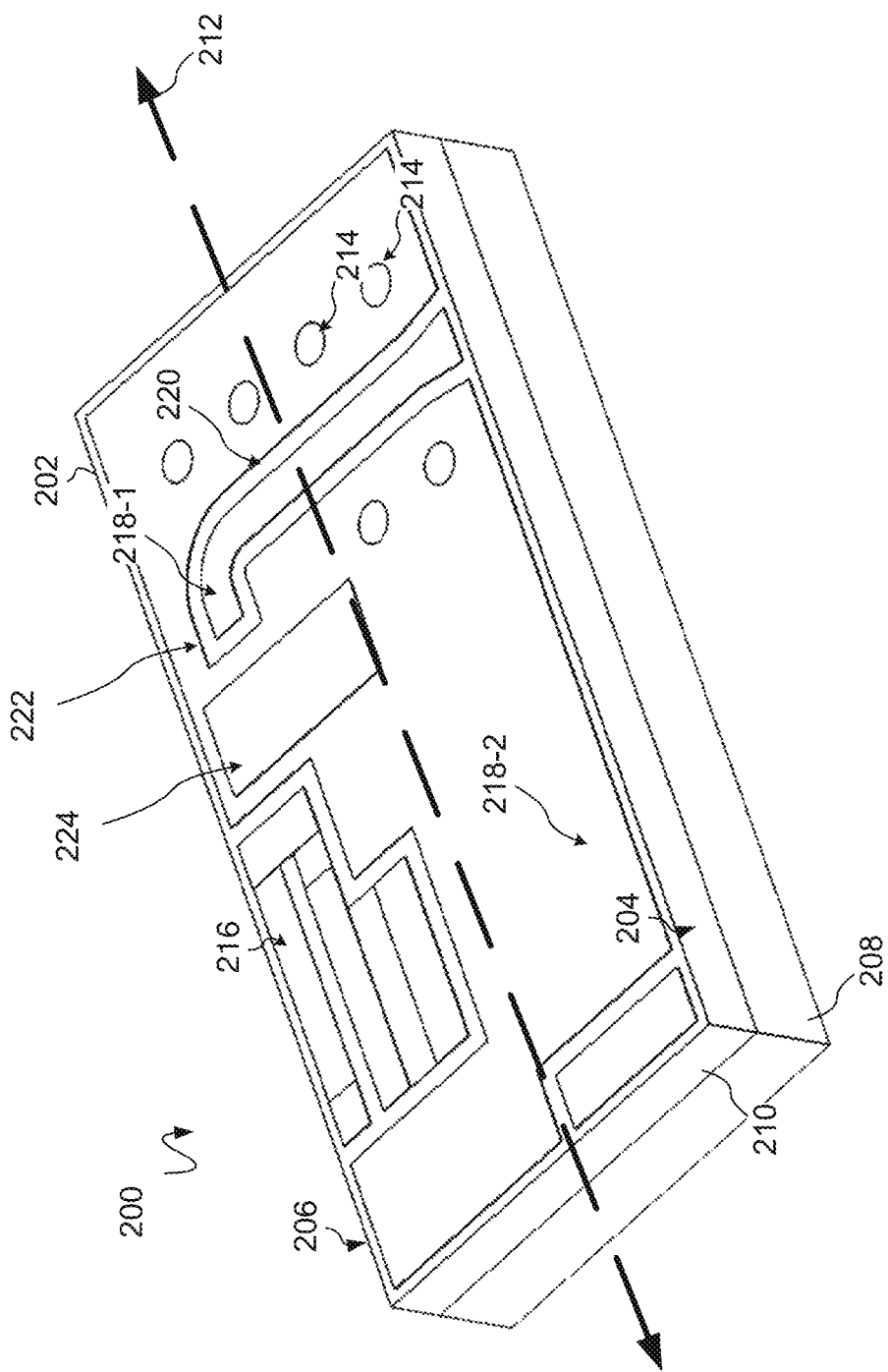
FIG. 2 is a perspective view of a laser subassembly suitable for use in a TOSA module within the multi-channel optical transceivers of FIGS. 1A and 1B, in accordance with an embodiment.

Referring to FIG. 1B, another embodiment of an optical transceiver 100' includes the same light engine (e.g., TOSAs 120*a-d* and ROSA 130) described above together with an optical multiplexer 111 and an optical demultiplexer 113. The optical multiplexer 111 and the optical demultiplexer 113 both may include arrayed waveguide gratings (AWGs). The optical multiplexer 111 is optically coupled to the transmit optical fibers 122 and the optical demultiplexer 113 is optically coupled to the receive optical fibers 132. The optical multiplexer 111 multiplexes the optical signals being transmitted over transmit optical fibers 122 to provide a multiplexed optical signal on an output optical fiber 115. The optical demultiplexer 113 demultiplexes a multiplexed optical signal received on an input optical fiber 117 to provide received optical signals on receive optical fibers 132. The output optical fiber 115 and the input optical fiber 117 are coupled to an output optical connector 116 and an input optical connector 118, respectively.

This embodiment of the optical transceiver 100' includes 4 channels and may be configured for coarse wavelength division multiplexing (CWDM), although other numbers of channels are possible. This embodiment of the optical transceiver 100' may also be capable of transmission rates of at least about 25 Gbps per channel and transmission distances of 2 km to at least about 10 km and may be used in internet data center applications or fiber to the home (FTTH) applications.

FIGS. 2-5P shows an example laser subassembly 200 in accordance with an embodiment of the present disclosure. As shown, the laser subassembly 200 includes a subassembly substrate 202, which may also be referred to as a laser submount or simply a substrate. The substrate 202 includes a signal path layer 210 (or power plane 210) disposed on a ground plane layer 208 in a sandwich fashion. The trace layer 210 may comprise, for example, a dielectric material such as glass, silicon, or other suitable substrate material. A plurality of conductive traces formed of a metal such as copper may be disposed on the signal path layer 210 to provide a driving signal to a laser device, as discussed in greater detail below. The conductive traces may comprise, for example, microstrip transmission lines. The ground plane 208 may comprise a metal, or metal alloy. In an embodiment, the ground plane 208 comprises copper or a copper foil.

The substrate 202 further includes a first end 204 disposed opposite a second end 206. The longitudinal axis 212 of the substrate 202 can extend in parallel with surfaces defining the first and second ends 204, 206. Stated differently, as shown the first and second ends 204, 206, respectively, are disposed cross-wise from each other rather than at opposite ends of the substrate 202, which is to say lengthwise from each other. The first end 204 may be adjacent the transmit connecting circuit 104, and therefore, may be referred to as an electrical coupling end. The second end 206 may be adjacent an optical fiber coupling end (See FIG. 4), and therefore may be referred to as an optical coupling end. By patterning the substrate 202 with the electrical coupling end and optical coupling end opposite each other in cross-wise fashion advantageously reduces the time of flight for driving signals. However, other configurations are within the scope of this disclosure and the particular embodiment shown in FIG. 2 should not be construed as limiting.

Figure 3:
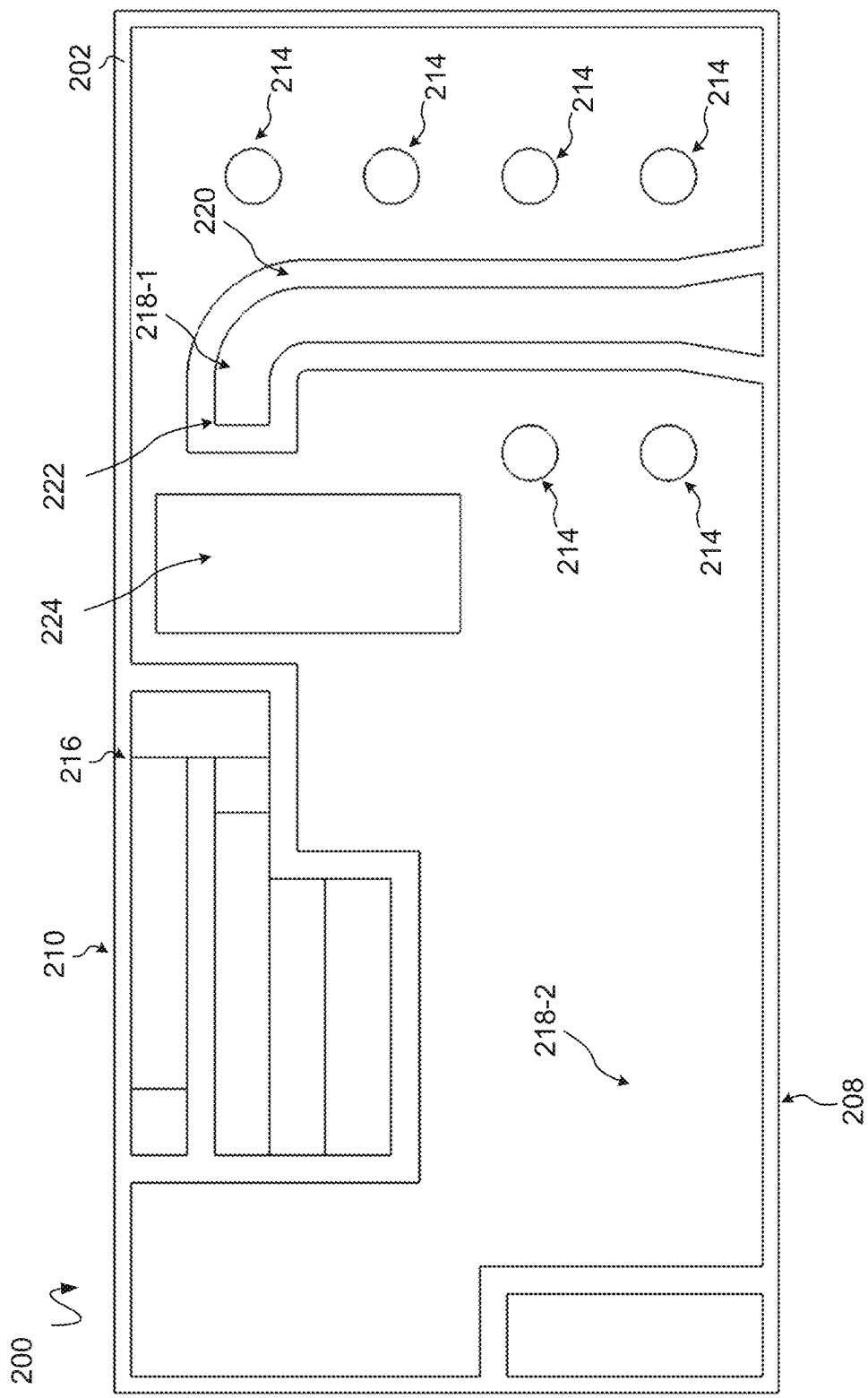
FIG. 3 is a top view of a signal path layer of the laser subassembly of FIG. 2, in accordance with an embodiment.

Continuing on, and with specific reference to FIG. 3, the signal path layer 210 includes a bent grounded coplanar waveguide (GCPW) patterning configuration with an integrated impedance matching network 216. The GCPW patterning configuration includes a first signal conductor 218-1 disposed/formed on top of the surface defining the substrate 202. The first signal conductor 218-1 includes a bent-configuration whereby the section 222 adjacent the second end 206 of the substrate 202 includes a substantially 90-degree bend. The section 222 may also be referred to as the laser driver (LD) coupling section. The GCPW patterning configuration further includes a second signal conductor 218-2, which may be electrically coupled to the first signal conductor to vary impedance of the substrate 202 by way of the integrated impedance matching network 216, which is discussed in greater detail below.

The GCPW patterning configuration further includes a conductive laser mounting section 224, with the conductive laser mounting section 224 configured to couple a laser device (not shown) to the surface defining the signal path layer 210. The laser device may comprise, for example, an Electro-absorption Modulated Laser (EML), which includes a distributed feedback (DFB) laser diode and an electro-absorption modulator (EAM) integrated on a single optoelectronic integrated circuit (IC) chip. A driver chip external to the EML device can provide an electrical driving signal to the EAM, which in turn can modulate the DFB laser diode based on the same. Other laser devices are within the scope of this disclosure, such as Fabry-Perot (FP) lasers.

The impedance matching network 216 can include a plurality of resistors (or resistive elements) that may be selectively coupled for purposes of introducing a desired amount of resistance for purposes of impedance matching. Impedance may be selectable at both a fine and course-grain level using a relatively small number of resistors and interconnections between those resistors, e.g., wire bonds. For instance, some configurations permit relatively large impedance changes, e.g., <±10%, while other configurations permit incremental changes of ±3% or less. Some non-limiting example resistor values are provided below for illustration. The resistors of the impedance matching network 216 can include Surface Mount (SMD) resistors, thin-film resistors, other suitable resistor devices, or a combination thereof, for example.

Continuing on, the GCPW patterning configuration allows for the first signal conductor 218-1 to be electrically coupled to the second signal conductor 218-2 by way of the conductive laser mounting section 224 and the impedance matching network 216. When coupled, the resulting driving circuit 234 (see FIG. 4) can include the conductive laser mounting section 224 electrically coupled in parallel with the impedance matching network 216. The driving circuit 234 may also be referred to as a laser driving circuit. Resistive elements of the impedance matching network 216 may then be selectively coupled to the driving circuit to ensure that the substrate 202 and laser diode 226 are matched within a predefined tolerance, e.g., within 10% and preferably within 5%.

Figure 4:
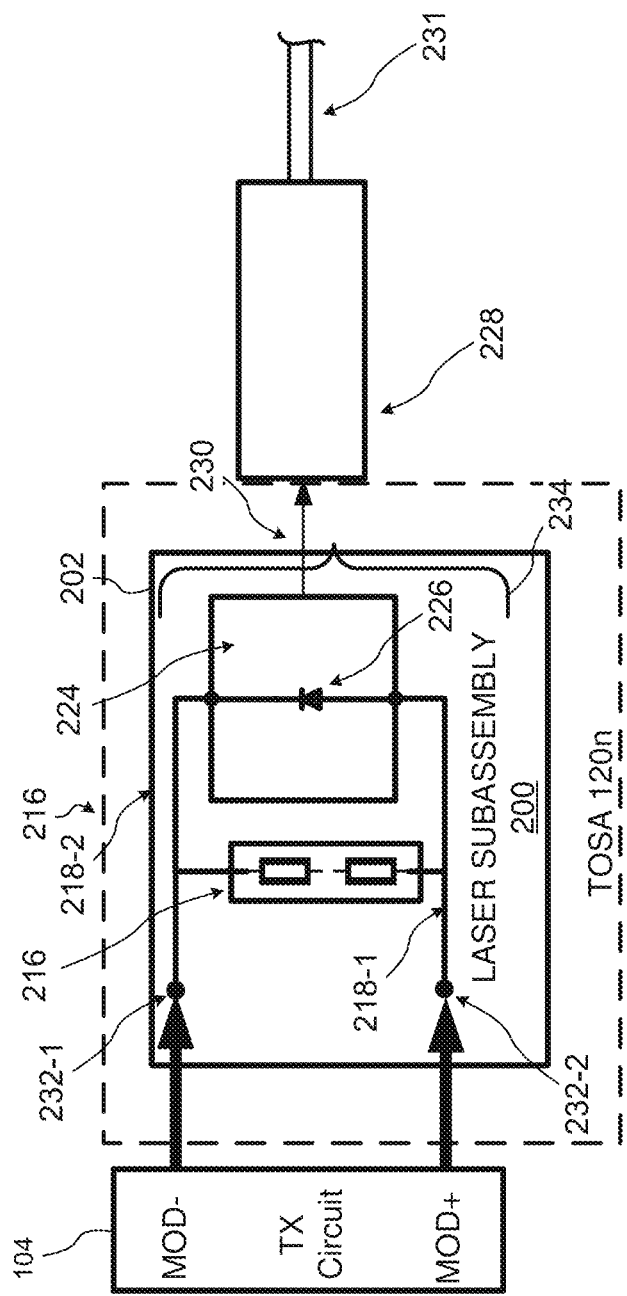
FIG. 4 is a block diagram illustrating an example schematic of a driving circuit disposed on the subassembly substrate of FIG. 2, in accordance with an embodiment.

FIG. 4 shows a highly simplified schematic diagram of TOSA module 120n having a laser subassembly 200 with the integrated impedance matching network 216 consistent with the present disclosure. As shown, the transmit connecting circuit 104 can provide a driving signal (MOD). The laser subassembly 200 electrically couples to the transmit connecting circuit 104 via driving circuit 234. In particular, terminals 232-1, 232-2 couple to the transmit connecting circuit 104 and receive the driving signal in the form of a voltage. The terminal 232-1 is electrically coupled to one end of the impedance matching network 216 and the conductive laser mounting section 224 by way of the first signal conductor 218-1. The terminal 232-2 is coupled to the opposite end of the impedance matching network 216 and the conductive mounting section 224 by way of the second signal conductor 218-2. A laser diode 226 such as an EML laser is mounted and electrically couples to the conductive laser mounting section 224, with a cathode electrically coupled to the first terminal 232-2 and an anode electrically coupled to the second terminal 232-2.

In operation, the TX connecting circuit 104 provides a driving signal (MOD−, MOD+). The driving circuit 234 receives the driving signal, and in response to receiving the driving signal, the laser diode 226 emits a light signal 230 having an associated channel wavelength. The channel wavelengths of the light signal 230 may then be launched on to a waveguide 231, e.g., an optical fiber, optically coupled into an optical coupling port 228. Although not shown in FIG. 4, the laser subassembly 200 may include focusing optics, isolators, ferrule, and other passive and active optical devices to launch the light signal 230 on to the waveguide 231.

Figure 5A:
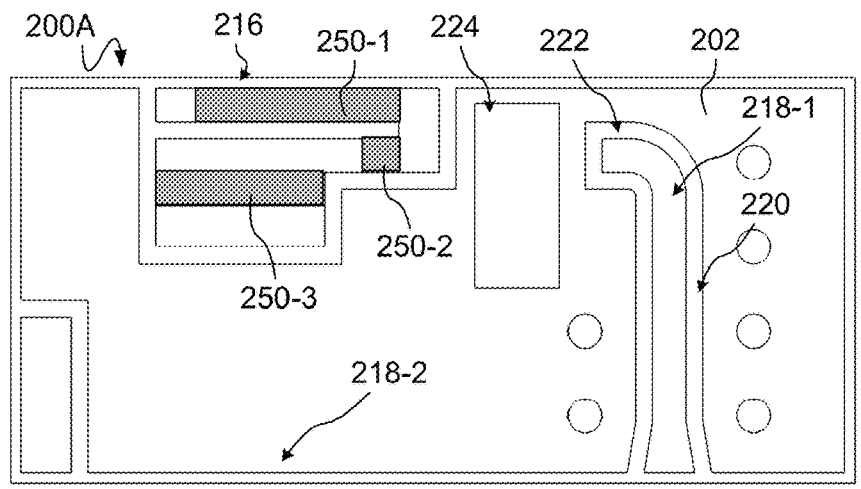
FIGS. 5A-5P illustrate various example configurations to introduce varying impedance in the driving circuit of FIG. 4, in accordance with embodiments of the present disclosure.

Turning to FIG. 5A, one example embodiment of a laser subassembly 200A is shown. As shown, the laser subassembly 200A includes an integrated impedance matching network 216 with an adjustable impedance arrangement. The adjustable impedance arrangement includes a first resistor 250-1 (R1), a second resistor 250-2 (R2) and a third resistor 250-3 (R3). In this embodiment, the adjustable impedance arrangement may also be referred to as a three-resistor network. Each of the following example configurations of the impedance matching network 216 include the values of R1=250Ω, R2=50Ω, and R3=10Ω. Note, the number of resistors and the particular resistor values are application-specific, and the particular values provided herein are not intended to be limiting. Each of the resistors 250-1, 250-2, and 250-3 are electrically coupled in series with each other, but without the addition of an interconnection device (e.g., wire bonds, straps, and so on) remain an open circuit. The terminals 270, 274 and 276 may then be electrically coupled into the driving circuit 234 to vary the impedance based on resistors 250-1, 250-2 and 250-3, as will now be discussed in further detail.

Figure 5B:
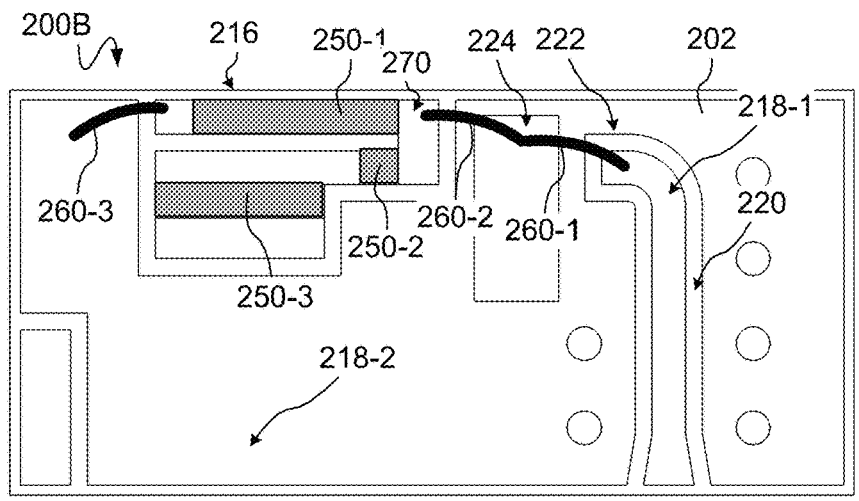

FIG. 5B shows an example embodiment of a laser subassembly 200B having an integrated impedance matching network 216 with a resistance equal to R1, e.g., 250Ω. As shown, the laser subassembly 200B includes a plurality of wire bonds, namely wire bonds 260-1, 260-2, and 260-3. The first wire bond 260-1 electrically couples the first signal conductor 218-1 to the conductive laser mounting section 224. The second wire bond 260-2 electrically couples the conductive laser mounting section 224 to a first end of the first resistor 250-1 (R1). The third wire bond 260-3 electrically couples the other end of the first resistor 250-1 (R1) to the second signal conductor 218-1, thus completing the driving circuit 234. As shown in FIG. 5B a relatively small number of wire bonds may be introduced to selectively couple 250Ω of resistance to the driving circuit in cases where the associated laser diode, e.g., the load, has a load impedance of about 250Ω. The wire bonds may be introduced by a technician during manufacture of the laser subassembly 200B.

Figure 5C:
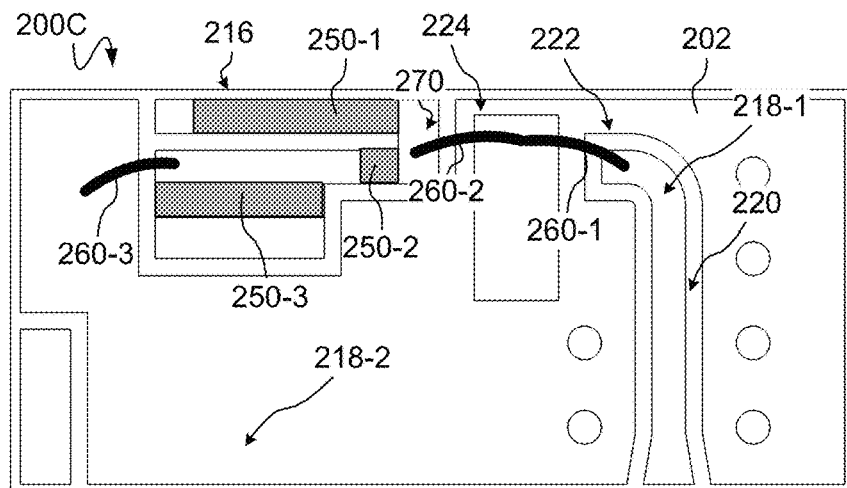

FIG. 5C shows another example embodiment of a laser subassembly 200C having an integrated impedance matching network 216 consistent with the present disclosure. As shown, the laser subassembly 200C is substantially similar to that of the laser subassembly 200B discussed above with reference to FIG. 5C. However, in the embodiment of FIG. 5C, the second resistor is coupled to the second signal conductor 218-2 by way of the first, second and third wire bonds 260-1, 260-2, 260-3 to complete the driving circuit 234. In this case, the first and second resistors 250-1, 250-2 may include a first common terminal 270. The first common terminal 270 may extend substantially perpendicular to that of the first and second resistors 250-1, 250-2 and enables a relatively small footprint for the circuitry of the impedance matching network 216. In addition, the common terminal 270 advantageously reduces the overall number of wire bonds to achieve a desired resistance value. In any event, the laser subassembly 200C therefore selectively couples 50Ω of resistance to the driving circuit.

Figure 5D:
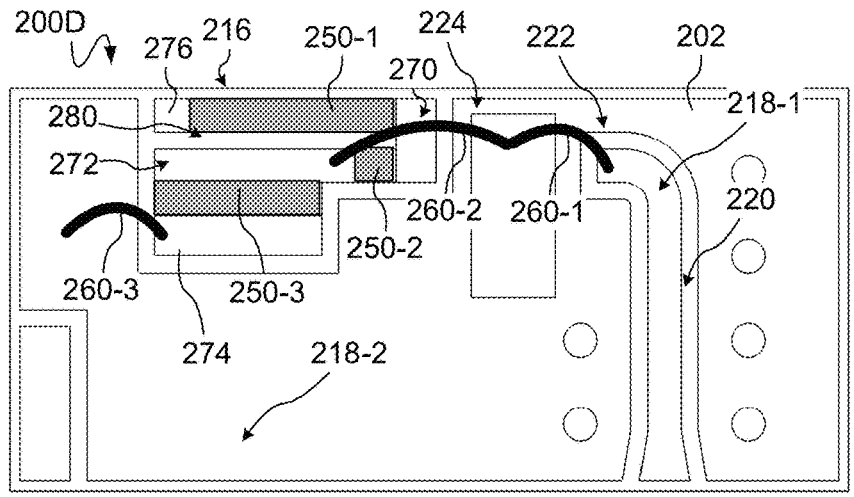

FIG. 5D shows another example embodiment of a laser subassembly 200D having an integrated impedance matching network 216 consistent with the present disclosure. As shown, the laser subassembly 200D has a second common terminal 272 associated with the second and third resistors 250-2, 250-3. The second common terminal 272 extends in parallel with the first and third resistors 250-1, 250-3. The second common terminal 272 may be electrically coupled to the first, second and third resistors 250-1, 250-2, 250-3. The first wire bond 260-1 electrically couples the first signal conductor 218-1 to the conductive laser mounting section 224. The second wire bond 260-2 electrically couples the conductive laser mounting section 224 to the second common terminal 272, and thus by extension a first end of the third resistor 250-3 (R3). The third wire bond 260-3 electrically couples the other end of the third resistor 250-3 (R3) to the second signal conductor 218-2 to complete the driving circuit 234. Thus, the laser subassembly 200D selectively couples 10Ω of resistance to the driving circuit.

Figure 5E:
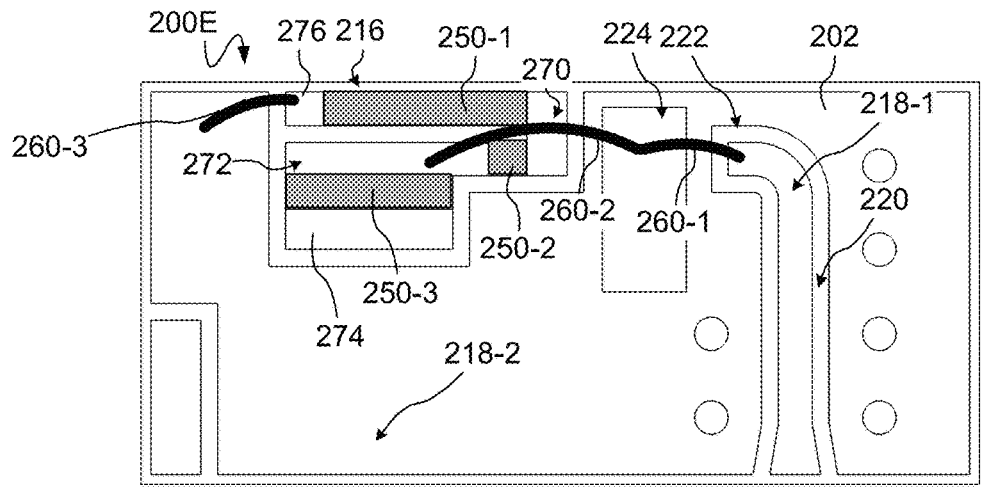

FIG. 5E shows another example embodiment of a laser subassembly 200E having an integrated impedance matching network 216 consistent with the present disclosure. As shown, the first wire bond 260-1 electrically couples the first signal conductor 218-1 to the conductive laser mounting surface 224. The second wire bond 260-2 electrically couples the conductive laser mounting surface 224 to the second common terminal 272. The second common terminal 272 electrically couples to a first end of the first resistor 250-1 (R1) by way of the first common terminal 270. The other end of the first resistor 250-1 (R1) then electrically couples to the second signal conductor 218-2 to complete the driving circuit. Thus, the first and second common terminals 270, 272 may be advantageously utilized to selectively electrically couple both the first and second resistors 250-1, 250-2 in series within the driving circuit 234 to selectively sum their resistance values (e.g., R1 (250Ω)+R2 (50Ω)=300Ω).

Figure 5F:
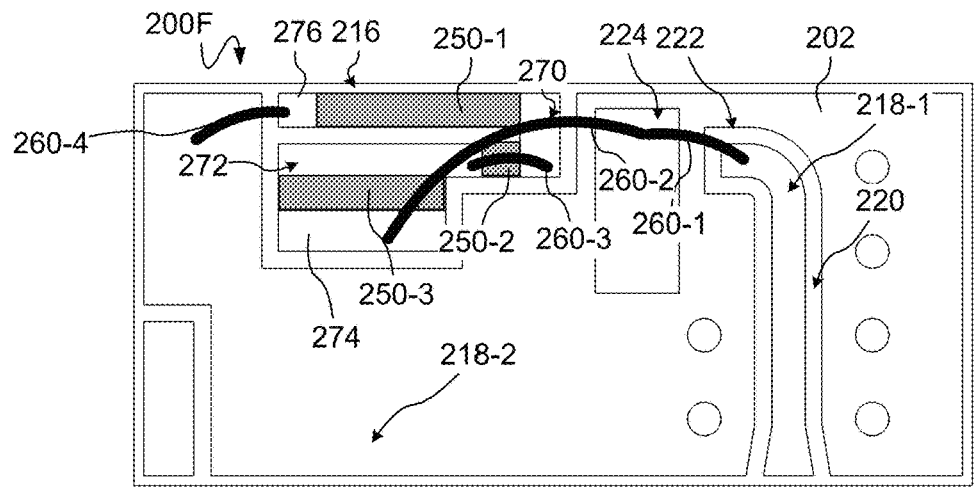

FIG. 5F shows another example embodiment of a laser subassembly 200F having an integrated impedance matching network 216 consistent with the present disclosure. As shown, the first wire bond 260-1 electrically couples the first signal conductor 218-1 to the conductive laser mounting surface 224. The second wire bond 260-2 electrically couples the conductive laser mounting surface 224 to a first terminal of the third resistor 250-3. As discussed above, the third resistor 250-3 (R3) is electrically coupled to the second common terminal 272. The second common terminal 272 then electrically couples to the first common terminal 270 by way of the third wire bond 260-3. The first common terminal 270 is electrically coupled to the first resistor 250-1 (R1). The first resistor 250-1 (R1) is then electrically coupled to the second signal conductor 218-2 by way of a fourth wire bond 260-4. Thus, the embodiment shown in FIG. 5F can selectively electrically couple the first and third resistors 250-1, 250-2 in series within the driving circuit to sum their respective resistance values (e.g., R1 (250Ω)+R3 (10Ω)=260Ω).

Figure 5G:
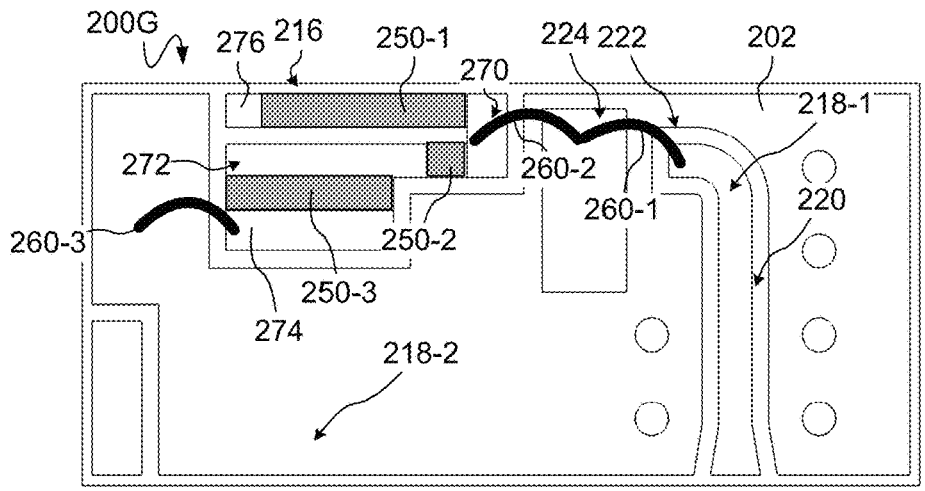

FIG. 5G shows another example embodiment of a laser subassembly 200G having an integrated impedance matching network 216 consistent with the present disclosure. As shown, the first wire bond 260-1 electrically couples the first signal conductor 218-1 to the conductive laser mounting surface 224. The second wire bond 260-2 electrically couples the conductive laser mounting surface 224 to the first common terminal 270. The third wire bond 260-3 electrically couples the terminal 274 of the third resistor 250-3 to the second signal conductor 218-2 to complete the driving circuit 234. Thus, the embodiment shown in FIG. 5G can selectively electrically couple the second and third resistors 250-2, 250-3 in series within the driving circuit 234 to sum their respective resistance values (e.g., R2 (10Ω)+R3 (50Ω)=60Ω).

Figure 5H:
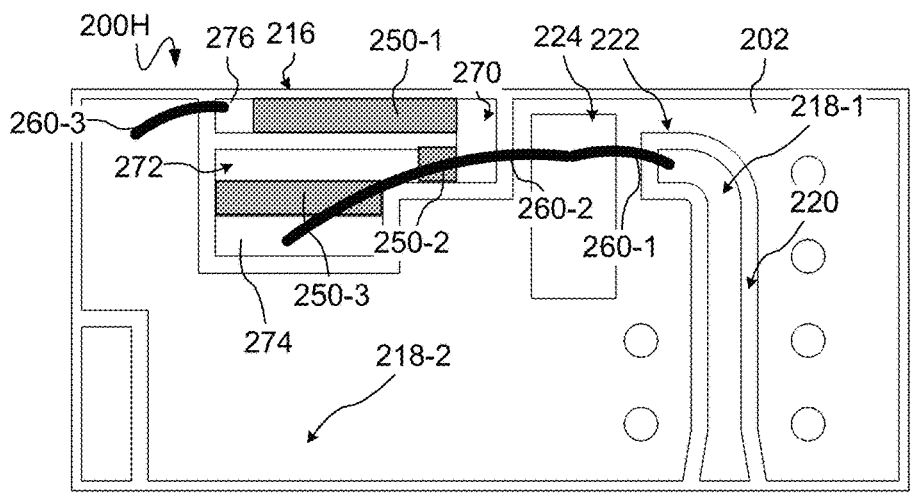

FIG. 5H shows another example embodiment of a laser subassembly 200H having an integrated impedance matching network 216 consistent with the present disclosure. As shown, the first wire bond 260-1 electrically couples the first signal conductor 218-1 to the conductive laser mounting surface 224. The second wire bond 260-2 electrically couples the conductive laser mounting surface 224 to a terminal 274 of the third resistor 250-3 (R3). The third wire bond 260-3 electrically couples the terminal 276 of the first resistor 250-1 (R1) to the second signal conductor 218-2 to complete the driving circuit 234. Coupling of terminals 274, 276 to the conductive laser mounting section 224 and the second signal conductor 218-2, respectively, puts each of the first, second and third resistors 250-1, 250-2, and 205-3 in series. Thus, the embodiment shown in FIG. 5G results in the sum of the first, second and third resistors 250-1, 250-2, and 250-3 (e.g., R1 (250Ω)+R2 (10Ω)+R3 (50Ω)=310Ω) being introduced in the driving circuit 234.

Figure 5I:
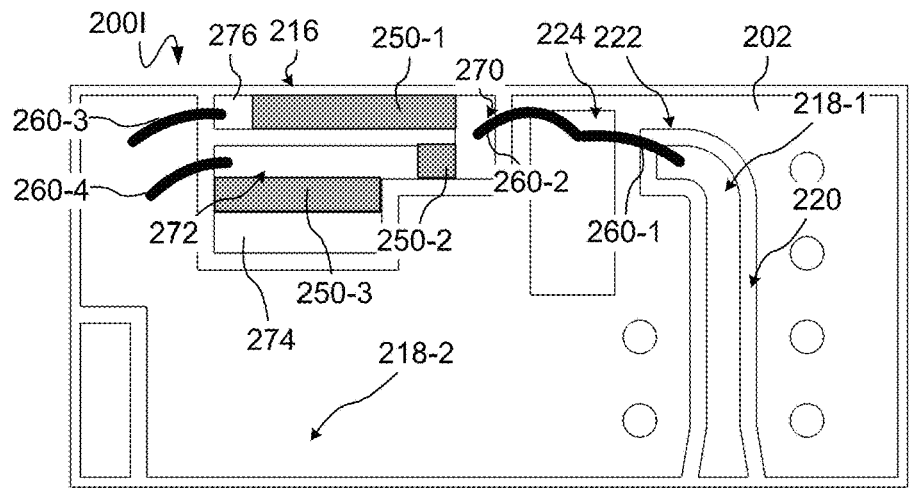

FIG. 5I shows another example embodiment of a laser subassembly 200I having an integrated impedance matching network 216 consistent with the present disclosure. As shown, the first wire bond 260-1 electrically couples the first signal conductor 218-1 to the conductive laser mounting surface 224. The second wire bond 260-2 electrically couples the conductive laser mounting surface 224 to the first common terminal 270. The third and fourth wire bonds 260-2, 260-3 each couple to the second signal conductor 218-2. The result of the embodiment of FIG. 5I is the first and second resistors 250-1, 250-2 being electrically coupled in parallel in the driving circuit, with the total resistance of these two resistors in parallel being the inverse of the sum of their respective inverse resistance values (R=(R1$^{-1}$+R2$^{-1}$)$^{-1}$). Which can be expressed as 1/(1/R1 (250Ω)+1/R2 (50Ω))=41.67Ω.

Figure 5J:
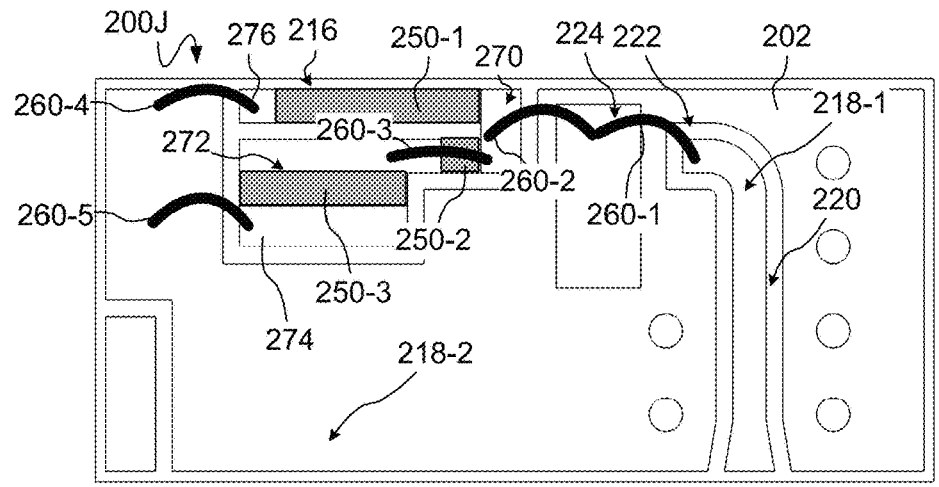

FIG. 5J shows another example embodiment of a laser subassembly 200J having an integrated impedance matching network 216 consistent with the present disclosure. As shown, the first wire bond 260-1 electrically couples the first signal conductor 218-1 to the conductive laser mounting surface 224. The second wire bond 260-2 electrically couples the conductive laser mounting surface 224 to the first common terminal 270. The third wire bond 260-3 electrically couples the first common terminal 270 to the second common terminal 272. The fourth wire bond 260-4 couples the terminal 276 of the first resistor 250-1 to the second signal conductor 218-2 to complete the driving circuit 234. Likewise, the fifth wire bond 260-5 couples the terminal 274 of the third resistor 250-3 to the second signal conductor 218-2. The result of the embodiment of FIG. 5J is the first and third resistors 250-1, 250-3 being electrically coupled in parallel in the driving circuit, with the total resistance of these two resistors in parallel being the inverse of the sum of their respective inverse resistance values (R=(R1$^{-1}$+R3$^{-1}$)$^{-1}$). Which can be expressed as 1/(1/R1 (250Ω)+1/R3 (10Ω))=9.62Ω.

Figure 5K:
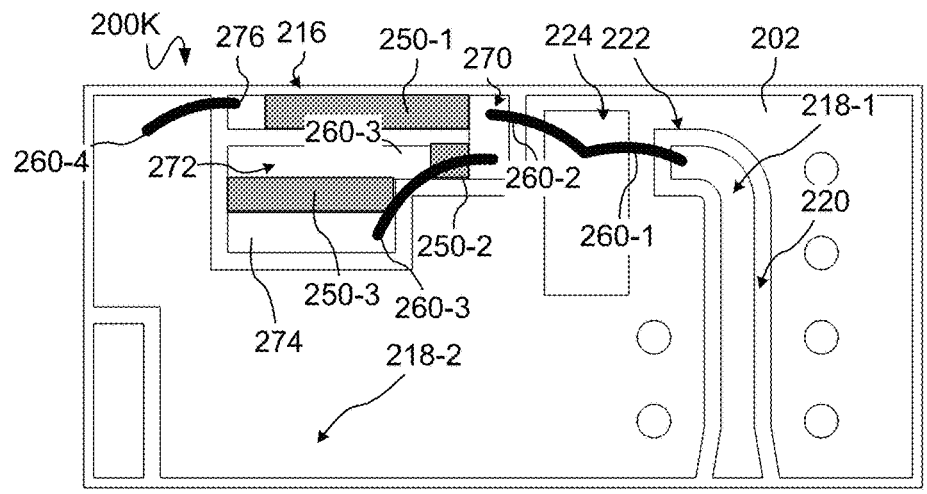

FIG. 5K shows another example embodiment of a laser subassembly 200K having an integrated impedance matching network 216 consistent with the present disclosure. As shown, the first wire bond 260-1 electrically couples the first signal conductor 218-1 to the conductive laser mounting surface 224. The second wire bond 260-2 electrically couples the conductive laser mounting surface 224 to the first common terminal 270. The third wire bond electrically couples the first common terminal 270 to the terminal 274 of the third resistor 250-3 (R3). The fourth wire bond 260-4 couples the terminal 276 of the first resistor 250-1 (R1) to the second signal conductor 218-2. The result of the embodiment of FIG. 5K is the second and third resistors 250-2, 250-3 being electrically coupled in parallel in the driving circuit 234, with the total resistance of these two resistors in parallel being the inverse of the sum of their respective inverse resistance values (R=(R2$^{-1}$+R3$^{-1}$)$^{-1}$). Which can be expressed as 1/(1/R2 (50Ω)+1/R3 (10Ω))=8.33Ω.

Figure 5L:
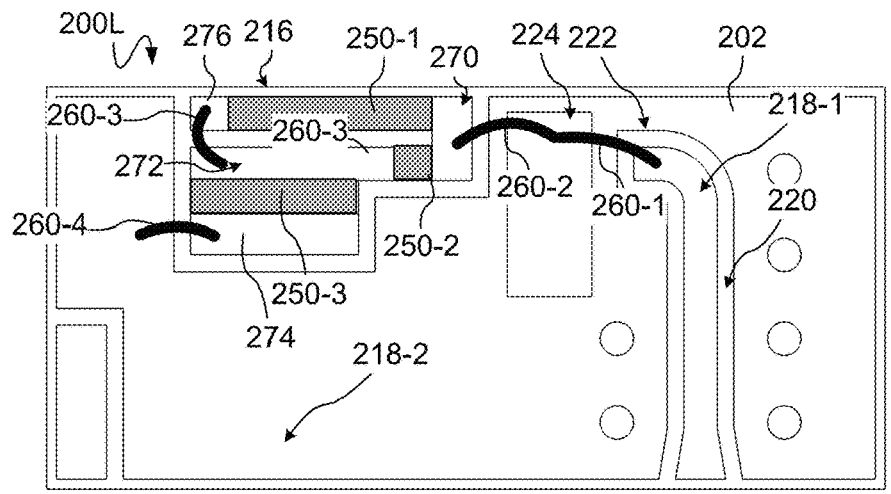

FIG. 5L shows another example embodiment of a laser subassembly 200L having an integrated impedance matching network 216 consistent with the present disclosure. As shown, the first wire bond 260-1 electrically couples the first signal conductor 218-1 to the conductive laser mounting surface 224. The second wire bond 260-2 electrically couples the conductive laser mounting surface 224 to the first common terminal 270. The third wire bond 260-3 electrically couples the second common terminal 272 to the terminal 276 of the first resistor 250-1 (R1). The fourth wire bond 260-4 electrically couples the terminal 274 of the third resistor 250-3 (R3) to the second signal conductor 218-2. The result of the embodiment of FIG. 5L is the first and second resistors 250-1, 250-2 being electrically coupled in parallel with each other, and in series with the third resistor 250-3 in the driving circuit, with the total resistance of R1 and R2 in parallel being the inverse of the sum of their respective inverse resistance values $((R1^{-1}+R2^{-1})^{-1}+R3)$. Thus, the total resistance for this embodiment may be expressed as $1/(1/R1\ (250\Omega)+1/R2\ (50\Omega))+R3\ (10\Omega)=51.67$.

Figure 5M:
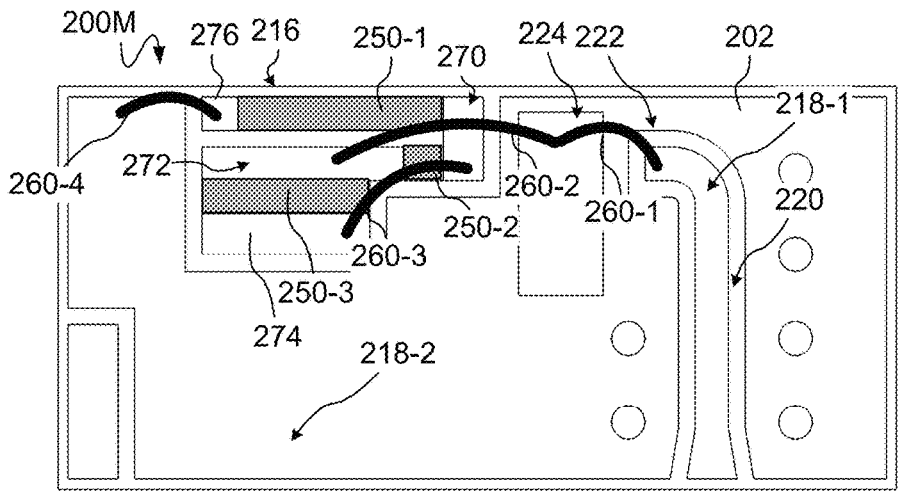

FIG. 5M shows another example embodiment of a laser subassembly 200M having an integrated impedance matching network 216 consistent with the present disclosure. As shown, the first wire bond 260-1 electrically couples the first signal conductor 218-1 to the conductive laser mounting surface 224. The second wire bond 260-2 electrically couples the conductive laser mounting surface 224 to the second common terminal 272. The third wire bond 260-3 electrically couples the first common terminal 270 to the terminal 274 of the third resistor 250-3 (R3). The fourth wire bond 260-4 electrically couples the terminal 276 of the first resistor 250-1 (R1) to the second signal conductor 218-2. The result of the embodiment of FIG. 5M is the second and third resistors 250-1, 250-2 being electrically coupled in parallel with each other, and in series with the first resistor 250-1 in the driving circuit, with the total resistance of R2 and R3 in parallel being the inverse of the sum of their respective inverse resistance values $((R2^{-1}+R3^{-1})^{-1}+R1)$. Thus, the total resistance for this embodiment may be expressed as $1/(1/R2\ (50\Omega)+1/R3\ (10\Omega))+R1\ (250\Omega)=258.33$.

Figure 5N:
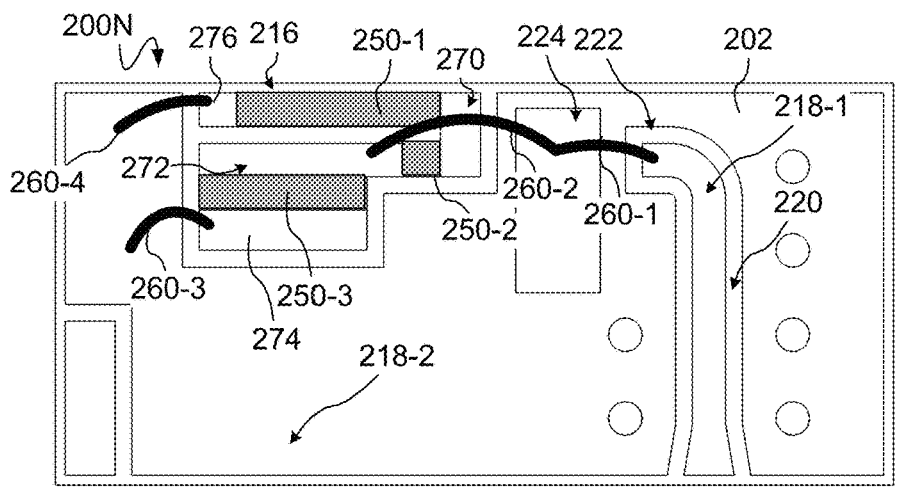

FIG. 5N shows another example embodiment of a laser subassembly 200N having an integrated impedance matching network 216 consistent with the present disclosure. As shown, the first wire bond 260-1 electrically couples the first signal conductor 218-1 to the conductive laser mounting surface 224. The second wire bond 260-2 electrically couples the conductive laser mounting surface 224 to the second common terminal 274. The third wire bond 260-3 electrically couples the terminal 274 of the third resistor 250-3 (R3) to the second signal conductor 218-2. The fourth wire bond 260-4 electrically couples the terminal 276 of the first resistor 250-1 (R1) to the second signal conductor 218-2. The result of the embodiment of FIG. 5N is the first and second resistors 250-1, 250-2 being electrically coupled in parallel with each other, and in parallel with the third resistor 250-3. Thus, the total resistance for this embodiment may be expressed as $1/((1/R1\ (250\Omega)+R2\ (50\Omega))+1/R3\ (10\Omega))=9.68$.

Figure 5O:
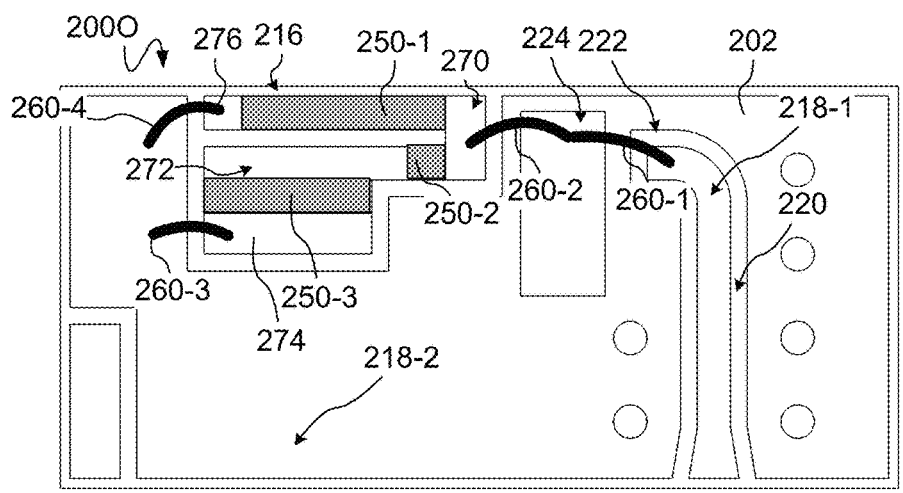

FIG. 5O shows another example embodiment of a laser subassembly 200O having an integrated impedance matching network 216 consistent with the present disclosure. As shown, the first wire bond 260-1 electrically couples the first signal conductor 218-1 to the conductive laser mounting surface 224. The second wire bond 260-2 electrically couples the conductive laser mounting surface 224 to the first common terminal 270. The third wire bond 260-3 electrically couples the terminal 274 of the third resistor 250-3 (R3) to the second signal conductor 218-2. The fourth wire bond 260-4 electrically couples the terminal 276 of the first resistor 250-1 (R1) to the second signal conductor 218-2. The result of the embodiment of FIG. 5O is the first and second resistors 250-1, 250-2 being electrically coupled in series with each other, and in parallel with the third resistor 250-3. Thus, the total resistance for this embodiment may be expressed as $1/((1/(R2\ (50\Omega)+R3\ (10\Omega))+1/R1\ (250\Omega))=48.39$.

Figure 5P:
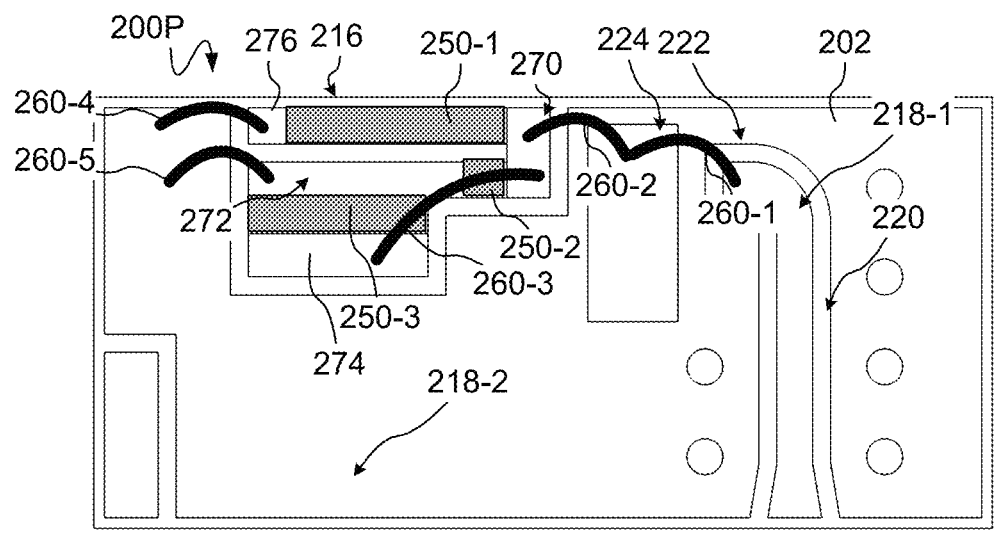

FIG. 5P shows another example embodiment of a laser subassembly 200P having an integrated impedance matching network 216 consistent with the present disclosure. As shown, the first wire bond 260-1 electrically couples the first signal conductor 218-1 to the conductive laser mounting surface 224. The second wire bond 260-2 electrically couples the conductive laser mounting surface 224 to the first common terminal 270. The third wire bond 260-3 electrically couples the first common terminal 270 to the terminal 274 of the third resistor 250-3 (R3). The fourth wire bond 260-4 electrically couples the terminal 276 of the first resistor 250-1 to the second signal conductor 218-2. The fifth wire bond 260-5 electrically couples the second common terminal 272 to the second signal conductor 218-2. The result of the embodiment of FIG. 5P is the first, second and third resistors 250-1, 250-2, 250-3 being electrically coupled in parallel with each other and the driving circuit $(R1^{-1}+R2^{-1}+R3^{-1})^{-1}$. Thus, the total resistance for this embodiment may be expressed as $1/(1/R1\ (250\Omega)+1/R2\ (50\Omega)+1/R3\ (10\Omega))=8.06$.

Figure 6:
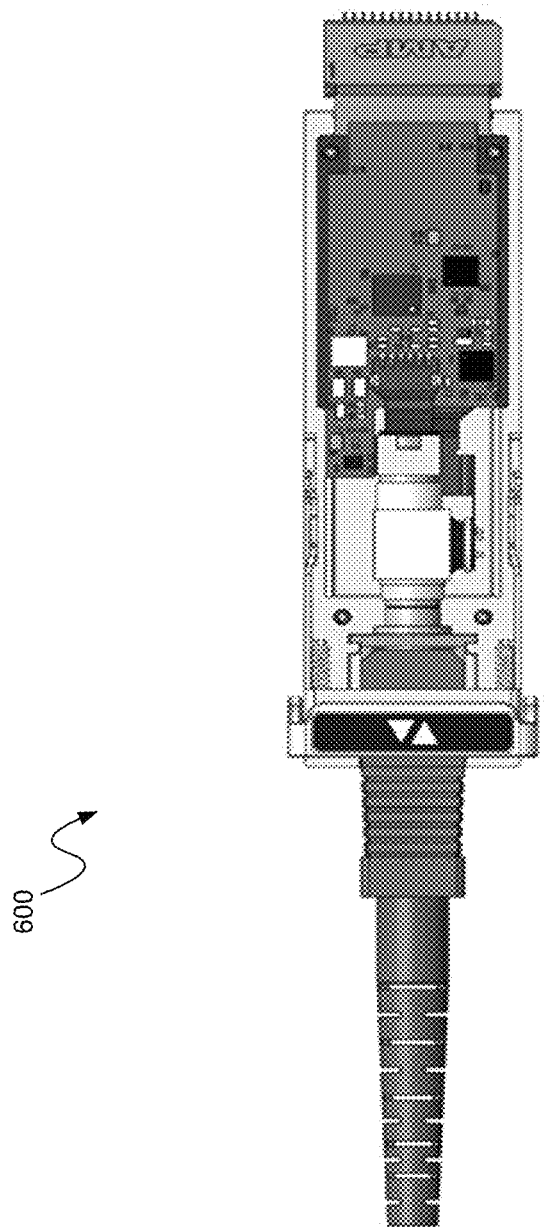
FIG. 6 is an example of a single-channel BOSA arrangement with a laser subassembly having an integrated impedance matching network consistent with an embodiment of the present disclosure.

While the foregoing examples and scenarios were presented in the context of a multi-channel transceiver, this disclosure is not limited in this regard. For example, FIG. 6 shows an example single-channel BOSA arrangement with a laser subassembly having an integrated impedance matching network consistent with the present disclosure.

In accordance with an aspect of the present disclosure an optical transmitter subassembly (TOSA) module is disclosed. The TOSA module comprising a substrate, a laser driving circuit disposed on the substrate for receiving a driving signal and modulating a laser emitter to cause the laser emitter to output an associated channel wavelength, the laser driving circuit including first and second signal conductors for electrically coupling to an external transmit circuit to receive the driving signal, a conductive laser mounting section for electrically coupling to a laser emitter and the first signal conductor, and an impedance matching network to electrically couple to the conductive laser mounting section and the second signal conductor, the impedance matching network including an adjustable impedance arrangement to select between a plurality of impedances to substantially match an impedance of the laser driving circuit to reduce signal reflection.

In accordance with another aspect of the present disclosure an optical transceiver is disclosed. The optical transceiver comprising a housing, a transmitter optical subassembly (TOSA) module disposed in the housing, the TOSA module comprising a substrate, and a laser driving circuit disposed on the substrate for receiving a driving signal and modulating a laser emitter to cause the laser emitter to output an associated channel wavelength, the laser driving circuit including first and second signal conductors for electrically coupling to an external transmit circuit to receive a driving signal, a conductive laser mounting section for electrically coupling to a laser emitter and the first signal conductor, and an impedance matching network to electrically couple to the conductive laser mounting section and the second signal conductor, the impedance matching network including an adjustable impedance arrangement to select between a plurality of impedances to substantially match an impedance of the laser driving circuit to reduce signal reflection, a receive optical subassembly (ROSA) module disposed in the housing.

In accordance with another aspect of the present disclosure a method for impedance matching between a laser emitter and a driving circuit for the laser emitter. The method comprising disposing a driving circuit on a signal layer of a substrate, the driving circuit comprising signal conductors for receiving a driving signal, a conductive laser mounting section for coupling to the laser emitter, and an impedance matching network having a plurality of resistive elements, coupling each of the plurality of resistive elements to each other, and electrically coupling at least a first resistive element of the plurality of resistive elements between the conductive laser mounting section and the impedance matching network to complete the driving circuit, the driving circuit including a circuit formed between the signal conductors, conductive laser mounting section and the impedance matching network, wherein electrically coupling at least the first resistive element includes electrically coupling less than all of the plurality of resistive elements to the driving circuit.

While the principles of the disclosure have been described herein, it is to be understood by those skilled in the art that this description is made only by way of example and not as a limitation as to the scope of the disclosure. Other embodiments are contemplated within the scope of the present disclosure in addition to the exemplary embodiments shown and described herein. Modifications and substitutions by one of ordinary skill in the art are considered to be within the scope of the present disclosure, which is not to be limited except by the following claims.

What is claimed is:

1. An optical transmitter subassembly (TOSA) module, the TOSA module comprising:
    a substrate;
    a laser driving circuit disposed on the substrate for receiving a driving signal and modulating a laser emitter to cause the laser emitter to output an associated channel wavelength, the laser driving circuit including:
        first and second signal conductors for electrically coupling to an external transmit circuit to receive the driving signal;
        a conductive laser mounting section for electrically coupling to a laser emitter and the first signal conductor; and
        an impedance matching network to electrically couple to the conductive laser mounting section and the second signal conductor, the impedance matching network including an adjustable impedance arrangement to select between a plurality of impedances to substantially match an impedance of the laser driving circuit to reduce signal reflection.

2. The TOSA module of claim 1, wherein the adjustable impedance arrangement includes a plurality of resistors disposed adjacent the conductive laser mounting section.

3. The TOSA module of claim 2, wherein the plurality of resistors are coupled to each other electrically in series.

4. The TOSA module of claim 2, wherein the impedance matching network further includes a plurality of terminals, the plurality of terminals allowing for one or more of the resistors to be selectively electrically coupled between the conductive laser mounting section and the second signal conductor.

5. The TOSA module of claim 4, wherein at least one terminal of the plurality of terminals is common between two resistors of the plurality of resistors.

6. The TOSA module of claim 2, wherein wire bonds electrically couple less than all of the plurality of resistors to the laser driving circuit to introduce a selected impedance.

7. The TOSA module of claim 2, wherein the resistors comprise surface mount resistor devices or thin-film resistor devices.

8. The TOSA module of claim 1, wherein the first signal conductor includes a bent grounded coplanar waveguide (GCPW) patterning configuration.

9. The TOSA module of claim 1, wherein the substrate comprises a signal layer disposed on a ground plane layer, the laser driving circuit being disposed on the signal layer, and wherein the signal layer includes a plurality of vias to electrically couple to the ground plane layer.

10. The TOSA module of claim 1, further including an Electro-absorption Modulated Laser (EML) coupled the conductive laser mounting section.

11. An optical transceiver comprising:
    a housing;
    a transmitter optical subassembly (TOSA) module disposed in the housing, the TOSA module comprising:
        a substrate; and
        a laser driving circuit disposed on the substrate for receiving a driving signal and modulating a laser emitter to cause the laser emitter to output an associated channel wavelength, the laser driving circuit including:
            first and second signal conductors for electrically coupling to an external transmit circuit to receive a driving signal;
            a conductive laser mounting section for electrically coupling to a laser emitter and the first signal conductor; and
            an impedance matching network to electrically couple to the conductive laser mounting section and the second signal conductor, the impedance matching network including an adjustable impedance arrangement to select between a plurality of impedances to substantially match an impedance of the laser driving circuit to reduce signal reflection;
    a receive optical subassembly (ROSA) module disposed in the housing.

12. The optical transceiver of claim 11, wherein the adjustable impedance arrangement includes a plurality of resistors disposed adjacent the conductive laser mounting section.

13. The optical transceiver of claim 12, wherein the plurality of resistors are coupled to each other electrically in series.

14. The optical transceiver of claim 12, wherein the impedance matching network further includes a plurality of terminals, the plurality of terminals allowing for one or more of the resistors to be selectively electrically coupled between the conductive laser mounting section and the second signal conductor.

15. The optical transceiver of claim 14, wherein at least one terminal of the plurality of terminals is common between two resistors of the plurality of resistors.

16. The optical transceiver of claim 12, wherein wire bonds electrically couple less than all resistors of the plurality of resistors to the laser driving circuit to introduce a selected impedance.

17. The optical transceiver of claim 12, wherein the resistors comprise surface mount resistor devices or thin-film resistor devices.

18. The optical transceiver of claim 11, wherein the first signal conductor includes a bent grounded coplanar waveguide (GCPW) patterning configuration.

19. A method for impedance matching between a laser emitter and a driving circuit for the laser emitter, the method comprising:

disposing a driving circuit on a signal layer of a substrate, the driving circuit comprising signal conductors for receiving a driving signal, a conductive laser mounting section for coupling to the laser emitter, and an impedance matching network having a plurality of resistive elements;

coupling each of the plurality of resistive elements to each other; and electrically coupling at least a first resistive element of the plurality of resistive elements between the conductive laser mounting section and the impedance matching network to complete the driving circuit, the driving circuit including a circuit formed between the signal conductors, conductive laser mounting section and the impedance matching network, wherein electrically coupling at least the first resistive element includes electrically coupling less than all of the plurality of resistive elements to the driving circuit.

20. The method of claim 19, wherein electrically coupling at least the first resistive element includes electrically coupling the first resistive element to the driving circuit via wire bonds.

* * * * *